United States Patent [19]

Harris et al.

[11] 4,078,980

[45] Mar. 14, 1978

[54] ELECTROLYTIC CHROMIUM ETCHING OF CHROMIUM-LAYERED SEMICONDUCTOR

[75] Inventors: James M. Harris; William M. Gouin, both of San Jose; Bruce Gray, Sunnyvale, all of Calif.

[73] Assignee: National Semiconductor Corporation, Santa Clara, Calif.

[21] Appl. No.: 728,575

[22] Filed: Oct. 1, 1976

[51] Int. Cl.$^2$ ............................ C25F 3/12; C25F 5/00
[52] U.S. Cl. ............... 204/129.3; 204/129.8; 204/146
[58] Field of Search ................ 204/129.1, 129.8, 146, 204/129.3

[56] References Cited
U.S. PATENT DOCUMENTS

| 2,409,097 | 10/1946 | Batcheller | 204/129.8 X |
| 2,751,342 | 6/1956 | Guggenberger | 204/129.8 |
| 2,840,521 | 6/1958 | Wasserman | 204/146 |
| 3,260,659 | 7/1966 | Willing et al. | 204/129.8 X |
| 3,314,869 | 4/1967 | Dobbin et al. | 204/129.8 |

Primary Examiner—John H. Mack
Assistant Examiner—D. R. Valentine
Attorney, Agent, or Firm—Gail W. Woodward; Willis E. Higgins

[57] ABSTRACT

A layer of chromium is removed from the metalization system on a silicon integrated circuit wafer that also includes copper and aluminum. By electrolytic etching in a sulfuric acid solution containing about 10% by volume water saturated with chromium sulfate, chromium can be removed without excessive removal of copper or aluminum.

10 Claims, 2 Drawing Figures

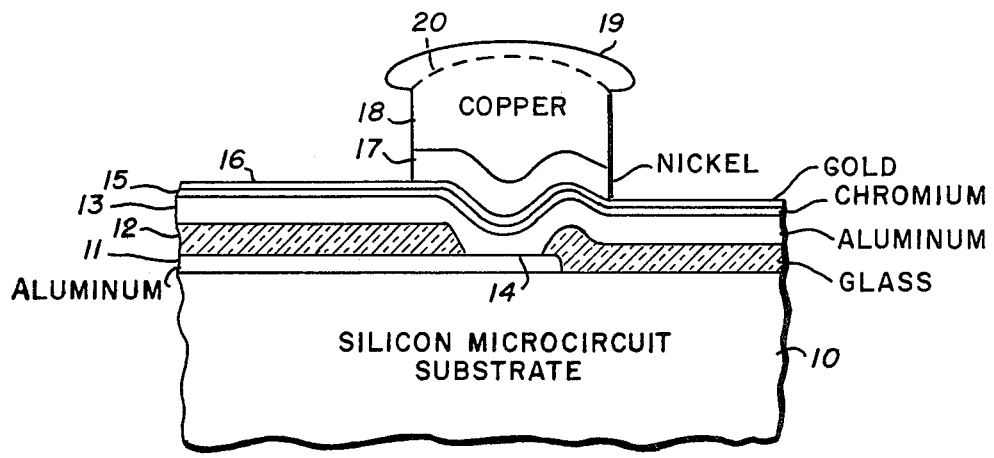
Fig_1
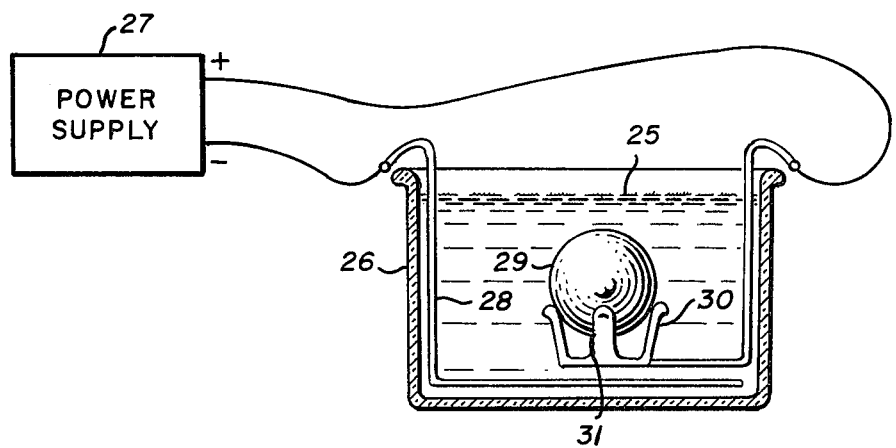
Fig_2

ELECTROLYTIC CHROMIUM ETCHING OF CHROMIUM-LAYERED SEMICONDUCTOR

BACKGROUND OF THE INVENTION

The invention is to be used in connection with a metalization system for contacting silicon monolithic microelectronic devices commonly known as integrated circuits (IC's) and the fabrication of contracts thereon. The typical silicon IC substrate has devices fabricated therein and is ordinarily provided with an aluminum interconnection layer. This is then covered by a deposited insulating layer of silicon dioxide or phosphosilicate glass (PSG). This layer protects the aluminum interconnect layer as well as the microelectronic substrate against scratches, abrasion, and contaminants. It also can act as the insulator for a second conductive pattern deposited on top of the glass.

In beam lead and bump contact devices the glass layer is etched to produce holes through which the underlayer of aluminum can be contacted. A series of metal layers is then deposited to build up a substantial thickness. The outermost layer being usually gold or copper which can be bonded by means of heat and/or pressure to mating contacts on a circuit board or lead frame. Thus the metal deposited onto a microcircuit device is used not only to make contact thereto, but also to provide a suitable bonding medium for joining the device to other circuit elements.

One widely used metalization system consists of successive layers of aluminum, chromium, gold, nickel, and copper. The first aluminum layer contacts the aluminum layer under the glass coating through conventional etched holes. The chromium layer adheres well to the aluminum and acts as a barrier between the aluminum and successive metal layers. The chromium is covered with a thin layer of contact metal such as gold, a heavy layer of nickel, which acts as a hardening or stiffening layer, and an outer heavy layer of copper. The layers of metal are selectively deposited and/or etched to leave bumps of the composite layers over the contact regions of the microcircuit. The copending application of James M. Harris Ser. No. 578,653 was filed May 19, 1975, now U.S. Pat. No. 4,042,954, is titled *METHOD FOR FORMING GANG BONDING BUMPS ON INTEGRATED CIRCUIT SEMICONDUCTOR DEVICES* and discloses a particular metal system.

The copper bumps have proven to be an excellent medium for thermocompression bonding of the microelectronic chips to either package leads or printed wiring substrates. A major difficulty that has been encountered in the preferred metalization system is in the chromium etching. Chromium is difficult to etch and practically all chromium etches attack aluminum and copper excessively. One solution to this problem is to make the aluminum and copper layers sufficiently thick or massive so that after chromium etching there is still sufficient metal left to produce satisfactory results. However, this approach often results in an unsatisfactory bump shape and the aluminum attack can undercut the bump thereby making the contact mechanically unsound. Other solutions to the problem have produced other unsatisfactory side effects. Most of the approaches to the problem require careful control of the etching operation and this does not lend itself to batch processing. Desirably a number of semiconductor wafers will be processed simultaneously. This means that etching should be continued until all wafers are etched sufficiently. Where the etch is critical, some wafers will be overetched. Accordingly, in the prior art processes, a single wafer is critically etched with some sort of monitoring during etching to avoid overetching. This is costly both in terms of having to handle each wafer and in terms of having to monitor.

SUMMARY OF THE INVENTION

It is the object of the invention to etch a chromium layer in a system that will not attack aluminum and copper excessively.

It is a further object of the invention to provide an electrolytic chromium etch that acts as a copper electropolish, as opposed to passivating the copper.

It is a feature of the invention that chromium etching can be done in a copper and aluminum containing system without excessive copper or aluminum attack so that little care need be exercised in the process and a great many parts can be treated in a batch process simultaneously.

These and other objects and features are achieved as follows. A microelectronic device wafer containing a plurality of circuits is successively coated with layers of aluminum, chromium, and gold. A photoresist is processed and developed to leave an array of holes in the resist where bumps are to be developed and layers of nickel and/or copper plated into the holes. The photoresist is removed and the exposed gold removed conventionally. Electrical contact is then made to the wafer and the wafer is immersed in a solution comprising trivalent chromium and sulfuric acid. Electrolytic etching is accomplished to rapidly remove the chromium. The electrolytic etching also results in low rate electropolishing of the exposed copper so that very little copper is removed. The attack on the aluminum is also very slow. After the last step of conventional aluminum removal, suitably shaped, copper tipped bumps remain and their shape and surface character are such as to enhance the subsequent thermocompression bonding.

BRIEF DESCRIPTION OF THE DRAWING

FIG. 1 shows a metalization system prior to etching; and

FIG. 2 shows the etching system.

DESCRIPTION OF THE INVENTION

The invention relates generally to the fabrication of integrated circuit (IC) devices in wafer form. A wafer or slice of semiconductor ingot is processed to have a plurality of individual circuits located therein. After fabrication of the wafer is completed, it is broken up into separate chips which contain the IC device to be packaged or handled separately. The invention specifically relates to the fabrication of copper bumps that are used to make external connection to the chips. The bumps extend upward from the chip face and, being copper, can be thermocompression bonded to a circuit board or to lead frame fingers for location in a housing. Thus the bumps serve to make electrical contact to the chip and to mechanically secure it into a larger structure.

FIG. 1 shows a metalization system that has been found to be very successful in the fabrication of copper bumps. The showing is of a portion of a chip that is part of a wafer. The vertical dimension of the drawing is not to scale in order to show the various metal layers. For the sake of clarity, the IC details are omitted. Substrate 10 is a silicon wafer that contains the IC devices (not shown). The surface of wafer 10 includes an aluminum interconnection layer 11 and a glass insulating layer 12. A second overlying connection layer of aluminum 13 contacts layer 11 at interface 14 by way of holes located in glass layer 12. In practice layer 13 is established to a thickness of about one micron over the entire substrate wafer and is then overcoated with successive layers of chromium 15 and gold 16. The gold layer 16 is typically about 400 A thick and is desired for its ease of platability and compatibility with the upper metal layers. The chromium layer 15 is typically about 1000 A thick and can act as a barrier layer between the aluminum and gold which would interact undesirably if in direct contact. Chromium adheres well to both aluminum and gold and, being relatively thin, chromium layer 15 does not contribute any significant electrical resistance to the contact system.

The wafer, with its coatings of aluminum, chromium, and gold, is then coated with a photoresist which is developed to harden it and to leave holes in it where copper bumps are to be made on the wafer. The holes are typically about 4 to 5 mils across. For the sake of clarity only one such bump is illustrated in FIG. 1. Then the wafer is electroplated with successive layers of nickel 17 and copper 18. FIG. 1 actually shows the bump after the photoresist has been removed following the electroplating operation. At 19 the bump shows an overhang that develops because the bump is higher than the photoresist. Typically the photoresist is about 1.3 mils thick. Nickel layer 17 is about 0.1 to 0.2 mil thick and the copper is deposited to between 1 and 1.5 mils. The nickel layer is used to provide a hard base for the copper bump and thus is present primarily for mechanical reasons. The copper is selected for its bondability, high electrical conductivity, and low cost. It will be noted that the only precious metal in the contact system at this point is gold layer 16 which is only a few hundred angstroms thick and therefore not in itself very costly.

The structure shown in FIG. 1 is subjected to a series of etches to remove the metal layers 13, 15, and 16 from the wafer except where they are covered by the copper bumps. The gold layer is easily removed by chemical solutions that do not rapidly attack the other metals in the system and the aluminum each can be formulated such that at worst, it only mildly attacks the copper and nickel. However, it is well known that chromium is difficult to remove and the conventional etching systems that will etch chromium also tend to attack either or both copper and aluminum. The copper attack can reduce the size of the bump and the aluminum attack will tend to undercut the bump. Typical prior art systems operated to fully remove the chromium over a wafer will on at least some portions of the wafer overetch the copper, aluminum or nickel.

In accordance with the invention, to avoid the undesirable etching effects, the chromium is removed in an electrolytic etching system, using a concentrated sulfuric acid solution containing a source of trivalent chromium ions. Using a constant voltage current source, this system will rapidly and smoothly etch the chromium layer 15 while attacking the copper and aluminum only slightly. In fact, the system will electropolish the copper, thus leaving the bumps with a desirable condition after etching. Dashed line 20 shows the shape of the bump after etching.

Getting the chromium ions into the sulfuric acid can be a problem because most chromium salts will not dissolve directly in the acid. One approach is to first dissolve the chromium salt, such as chromium sulfate, chromium chloride, or chromium potassium sulfate in a compatible solvent, such as water, and then combine the salt-containing solvent with the acid.

Unfortunately, the water in the sulfuric acid makes the solution more corrosive to the copper and aluminum so the water content is desirably kept as low as possible. Thus, in the interest of keeping the water content low, the chromium salt is dissolved therein to the maximum possible extent before combining with the sulfuric acid. In addition, after the combination is achieved, the water content can be reduced by heating the solution to evaporate the water. In this way, substantially water free solutions can be achieved to greatly reduce the corrosiveness of the solution.

As a practical matter, sufficient water is permitted in the system to facilitate the solution while keeping the content low enough to avoid excessive undesired corrosion.

FIG. 2 shows the etching system. Solution 25 is contained in tank 26. Power supply 27 has its negative terminal connected to an inert conductive contact 28. This can be composed of a mesh of stainless steel or titanium. Semiconductor wafer 29 is shown singly, but a number of them can be etched simultaneously. Wafer holder 30 includes a wafer contacting clip 31 and is connected electrically to the positive terminal of power supply 27. Wafer holder 20 may be composed of stainless steel or titanium and is desirably coated with stopoff lacquer except where it contacts a semiconductor wafer.

EXAMPLE

Chromium was etched from wafers in a system as shown in FIG. 2. The solution was composed of electronic grade sulfuric acid combined with 10% by volume of water saturated at 25° C with chromium sulfate. It was found that a suitably saturated solution could be obtained by agitating a container holding 100 grams of chromium sulfate and one liter of water for 24 hours at 25° C. A power supply having a nominal output of 5.2 volts was employed. It was found that the chromium could be completely removed from a batch of 9 wafers in about one (1) minute without excessive removal of copper or aluminum on any of the wafers.

Experimentation has further shown that the solution can contain from about 85% to about 95% sulfuric acid, the remainder being water saturated with chromium sulfate. In practice, the water is not necessarily fully saturated, but, in the interest of using as much chromium sulfate as possible, saturation is preferred. Too much water results in excessive copper or aluminum attack. It was found that satisfactory results could be obtained with up to about 20% water.

While chromium sulfate is preferred, other sources of trivalent chromium ions can be employed, such as chromium chloride or chromium potassium sulfate. The only requirement is that undesired reactions of sulfuric acid and the metals in the system be avoided.

Our invention has been described and a working embodiment set forth. It is clear that equivalents and modifications will occur to a person skilled in the art. Accordingly, it is intended that our invention be limited only by the following claims.

We claim:

1. An electrolytic etching solution for removing chromium in the presence of at least one other metal that in normally attacked by chromium etching solutions, said solution comprising sulfuric acid and an amount of trivalent chromium salt effective to reduce removal of said other metal, said salt being introduced into said solution by the addition thereto of a compound selected from the group consisting of chromium sulfate, chromium chloride, and chromium potassium sulfate.

2. The solution of claim 1 wherein said salt comprises chromium sulfate in a concentration of at least about 5 grams per liter of acid.

3. The solution of claim 1 wherein said solution further includes up to about 20 percent by volume water.

4. The solution of claim 1 wherein electronic grade sulfuric acid is combined with about 10% by volume of water approximately saturated at about 25° centigrade with a salt selected from the group consisting of chromium sulfate, chromium chloride, and chromium potassium sulfate.

5. The solution of claim 4 wherein between about 5% and about 15% of said salt saturated water is combined with said sulfuric acid.

6. The solution of claim 1 wherein etching is achieved using a constant voltage source operating at about 5 volts.

7. The process of removing chromium from a metal system including at least one other metal selected from the group consisting of copper and aluminum on a silicon semiconductor wafer, said process characterized as removing said chromium without excessive removal of said one other metal and comprising the steps of:

immersing said wafer in a solution of sulfuric acid containing trivalent chromium, said chromium being provided by including as a bath component a compound selected from the group consisting of chromium sulfate, chromium chloride, and chromium potassium sulfate, electrolytically etching said wafer, and continuing said etching until said chromium in contact with said solution is substantially removed from said wafer.

8. The process of claim 7 wherein from 5 to 15% by volume of water approximately saturated with chromium sulfate is combined with sulfuric acid.

9. The process of claim 7 wherein said solution comprises sulfuric acid, up to about 20% by volume water and a salt selected from the group consisting of chromium sulfate, chromium chloride and chromium potassium sulfate.

10. The process of claim 6 wherein said electrolytic etching step employs a constant voltage source operating at about 5 volts.

* * * * *